United States Patent [19]

Boyer

[11] Patent Number: 4,542,331

[45] Date of Patent: Sep. 17, 1985

[54] LOW-IMPEDANCE VOLTAGE REFERENCE

[75] Inventor: Richard M. Boyer, Orem, Utah

[73] Assignee: Signetics Corporation, Sunnyvale, Calif.

[21] Appl. No.: 564,869

[22] Filed: Dec. 23, 1983

Related U.S. Application Data

[63] Continuation-in-part of Ser. No. 519,440, Aug. 1, 1983.

[51] Int. Cl.⁴ .................................................. G05F 3/08
[52] U.S. Cl. ..................................... 323/313; 307/446; 307/458
[58] Field of Search ............... 323/312, 313, 314, 315, 323/316; 307/296 R, 297, 317 A, 445–446, 456–458

[56] References Cited

U.S. PATENT DOCUMENTS

| | | | |
|---|---|---|---|
| 3,648,153 | 3/1972 | Graf | 323/313 |
| 3,855,541 | 12/1974 | Leidich | 323/315 X |
| 4,110,634 | 8/1978 | Tokumaru et al. | 307/317 A |
| 4,228,371 | 10/1980 | Mazgy | 307/317 A |
| 4,249,091 | 2/1981 | Yamagiwa | 307/317 A |

OTHER PUBLICATIONS

Signetics Logic-TTL Data Manual, "Product Information", Signetics Corp., May 1978, pp. 27.-28.

Primary Examiner—Peter S. Wong
Attorney, Agent, or Firm—R. J. Meetin; R. T. Mayer; J. Oisher

[57] ABSTRACT

A voltage reference for providing a reference voltage ($V_{AB}$) between a pair of terminals (A and B) contains a diode (D) and a bipolar transistor (Q) whose base is coupled to one electrode of the diode. The collector of the transistor is coupled to a node (C) between one of the terminals (A) and the other electrode of the diode. The emitter of the transistor is coupled to the other terminal (B).

20 Claims, 10 Drawing Figures

LOW-IMPEDANCE VOLTAGE REFERENCE

CROSS REFERENCE TO RELATED APPLICATION

This is a continuation-in-part of U.S. patent application Ser. No. 519,440, filed Aug. 1, 1983.

FIELD OF USE

This invention relates to voltage references suitable for use in semiconductor integrated circuits. This invention also relates to circuits incorporating voltage references.

BACKGROUND ART

Voltage references which provide relatively constant reference voltages have many applications in integrated circuits. As one example, a voltage reference may be used to bias a bipolar transistor to a given level of conduction. As another example, a voltage reference may act as a clamp to prevent the voltage across a device from exceeding a specified voltage.

Figure 1A:
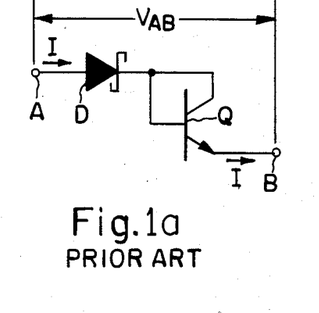
FIGS. 1a and 1b are circuit diagrams of a prior art voltage reference.

FIG. 1a illustrates a conventional voltage reference having a pair of points or terminals A and B across which is a reference voltage $V_{AB}$. This voltage reference consists of a Schottky diode D and a diode-connected NPN transistor Q. In particular, terminal A is connected to the anode of diode D. Its cathode is connected to the interconnected base and collector of transistor Q whose emitter is connected to terminal B so that all of the current I flowing between terminals A and B flows through diode D. Reference voltage $V_{AB}$ is the sum of the voltages across diode D and the base-emitter junction of transistor Q.

The value of voltage $V_{AB}$ is affected by the intrinsic semiconductor resistances associated with elements D and Q when the voltage reference is part of an integrated circuit. These internal resistances are explicitly shown in FIG. 1b. The cathode of diode D has an intrinsic resistance $r_D$. The anode of diode D is an electrical conductor, typically aluminum, and therefore has no intrinsic semiconductor resistance. The base, collector, and emitter of transistor Q have respective intrinsic resistances $r_B$, $r_C$, and $r_E$.

Figure 1B:
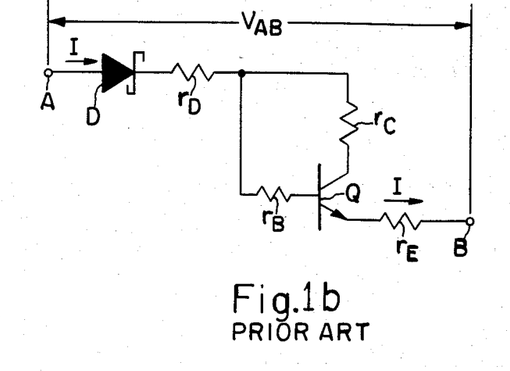

Upon taking the internal resistances into account, voltage $V_{AB}$ for this reference can be expressed as:

$$V_{AB}=(kT/q)\ln(I/I_{SS})+Ir_D+Ir_B/(\beta+1)+\phi_{BE}+Ir_E \quad (1)$$

In the first term which represents the voltage drop across the rectifying junction in diode D, k is Boltzmann's constant, T is the temperature of the voltage reference, q is the electronic charge, and $I_{SS}$ is the saturation current of diode D. $\phi_{BE}$ is the voltage drop across the base-emitter junction of transistor Q. In the remaining terms which are largely self-explanatory, $\beta$ is the amplification of transistor Q—i.e., the ratio of collector current to base current. $I_S$, $\beta$, and the intrinsic resistances increase with temperature, while $\phi_{BE}$ decreases with temperature. The rates of change of these parameters with temperature normally cause $V_{AB}$ to decrease slightly with increasing temperature.

The variation of voltage $V_{AB}$ with temperature is often a desirable feature since it acts to compensate for temperature-induced changes in characteristics of the portion of the integrated circuit using the voltage reference. However, the $V_{AB}$ temperature variation is not great enough to meet temperature compensation needs in certain applications. Operation is detrimentally affected. Moreover, the impedance of the reference of FIGS. 1a and 1b is unduly high in some applications.

Figure 2A:
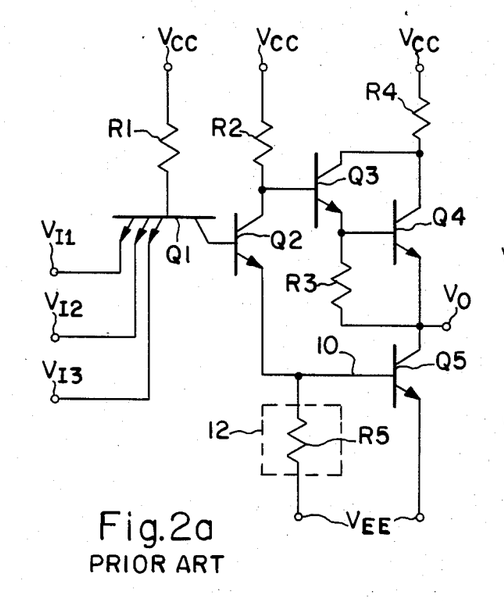

Voltage references of the foregoing type are used in numerous kinds of bipolar digital circuitry. Transistor-transistor logic (TTL) is one example. Turning to FIG. 2a, it shows a conventional arrangement for the common NAND logic structure which is the basis for TTL circuitry. In this TTL gate, a set of logical input voltage signals represented here by input voltages $V_{I1}$, $V_{I2}$, and $V_{I3}$ are provided to the corresponding emitters of a multiple-emitter NPN input transistor Q1. Its base is connected to a current source consisting of a resistor R1 connected to a source of a high supply voltage $V_{CC}$.

The Q1 collector is connected to the base of an NPN phase-splitting transistor Q2. Its collector is connected to a current source formed by a resistor R2 tied to the $V_{CC}$ supply. The Q2 collector is further connected to the base of an NPN transistor Q3 whose emitter drives an NPN output pull-up transistor Q4 and is also coupled through a resistor R3 to the Q4 emitter. The interconnected collectors of the Darlington pair Q3 and Q4 are connected to a current source consisting of a resistor R4 tied to the $V_{CC}$ supply.

The Q2 emitter is connected by way of a line 10 to the base of an NPN output pull-down transistor Q5 whose emitter is connected to a source of a low supply voltage $V_{EE}$. A logical output voltage signal $V_O$ is provided from the interconnection of the Q5 collector and the Q4 emitter. A passive output pull-down circuit 12 consisting here of a resistor R5 is connected between the $V_{EE}$ supply and the Q5 base by way of line 10.

The connection of the Q1 collector to the Q2 base was originally the distinguishing feature of TTL circuitry. More recently, the definition of TTL has loosened somewhat. TTL today generally means a family of bipolar devices having certain input/output characteristics. The internal circuitry of current TTL gates may contain some circuitry that would strictly fall in another logic family such as diode transistor logic, integrated injection logic, and the like. Even the Q1 collector-Q2 base connection may be absent as long as the necessary input/output conditions are satisfied within the general realm of TTL design.

Figure 2B:
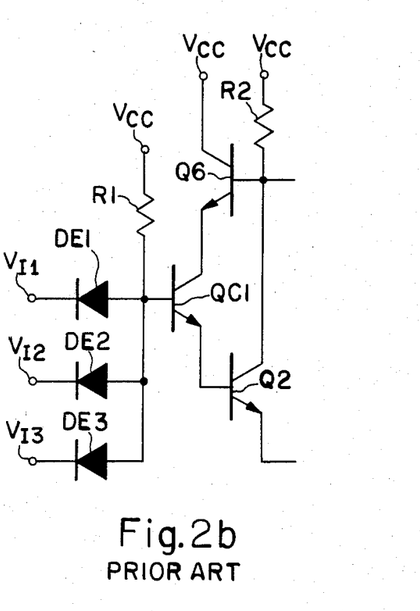

FIG. 2b shows the input portion of a conventional TTL-type NAND gate configured according to the more modern definition of TTL. In FIG. 2b, the combination of PN-junction diodes DE1, DE2, and DE3 and the base-emitter junction of an NPN input transistor QC1 replaces transistor Q1. Resistor R1 is connected between the $V_{CC}$ supply and the junction of the QC1 base with the anodes of diodes DE1–DE3 whose cathodes respectively receive inputs $V_{I1}$–$V_{I3}$. The QC1 collector is here connected to the emitter of an NPN transistor Q6 whose collector is tied to the $V_{CC}$ supply. The Q6 base is connected to the Q2 collector so as to form (in conjunction with transistor QC1) a "kicker" circuit that speeds up the switching of phase splitter Q2.

DISCLOSURE OF THE INVENTION

In accordance with the invention, a low-impedance voltage reference contains a diode and a bipolar transistor so configured as to provide more temperature compensation than in the prior art voltage reference described above. In particular, the present voltage reference provides a reference voltage between a first terminal and a second terminal that decreases more greatly with temperature than that of the prior art reference.

The diode in the present reference has a first electrode and a second electrode that form a rectifying junction. The transistor has a collector, an emitter, and a base. The collector is coupled to a node between the first terminal and the first electrode. The emitter is coupled to the second terminal. The base is coupled to the second electrode in such a manner that the diode is oriented in the forward conductive direction of the base-emitter junction of the transistor.

Only a small portion of the current travelling between the terminals flows through the diode and its associated intrinsic resistance. As a result of this and the increase in transistor amplification with temperature, the voltage drop across the rectifying junction in the diode decreases more rapidly with temperature than in the prior art voltage reference so as to provide the increased temperature compensation.

For the case in which the diode is a Schottky diode, the voltage drops across its rectifying junction and its intrinsic resistance are both lower than in the prior art voltage reference. In this case, the impedance of the present voltage reference is less than that of the prior art reference.

The reference voltage may be increased by adding one or more further diodes in series between the second electrode of the first diode and the base of the transistor. Each further diode is oriented in the forward conductive direction of the base-emitter junction.

In one application where the diode is a Schottky diode, the present voltage reference is part of a "kicker" circuit suitable for a logic gate. The kicker circuit contains a like-polarity second bipolar transistor having a collector coupled to a voltage supply, an emitter, and a base coupled to the first terminal. A like-polarity third bipolar transistor has a collector coupled to the second terminal. The base of the third transistor is coupled to the emitter of the second transistor. If the collector of the second transistor is connected directly to the voltage supply, the turning on of the second transistor enables it to provide current very rapidly to the base of the third transistor to cause it to turn on quickly. The voltage reference then prevents the third transistor from going into deep saturation. This enables the third transistor to turn off rapidly in response to the turning off of the second transistor.

BRIEF DESCRIPTION OF THE DRAWINGS

FIG. 2a is a circuit diagram of a conventional TTL NAND gate, while FIG. 2b is a circuit diagram of an input section employable in the NAND gate of FIG. 2a.

Like reference symbols are employed in the drawings and in the description of the preferred embodiments to represent the same or very similar item or items.

DESCRIPTION OF THE PREFERRED EMBODIMENTS

Figure 3A:
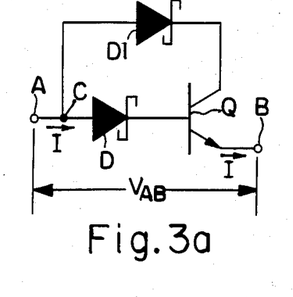
FIGS. 3a and 3b are circuit diagrams of an embodiment of a voltage reference in accordance with the invention.

Referring to the drawings, FIG. 3a illustrates a voltage reference formed as part of an integrated circuit. This voltage reference contains schottky diode D and NPN transistor Q that provide reference voltage $V_{AB}$ between terminals A and B when elements D and Q are both conductive. As in FIG. 1a, the anode of diode D is connected to terminal A, while the emitter of transistor Q is connected to terminal B. The cathode of diode D is again connected to the base of transistor Q. In contrast to FIG. 1a, the collector of transistor Q in FIG. 3a is coupled to a node C between terminal A and the anode of diode D.

The voltage reference of FIG. 3a also contains a Schottky diode D1 in the collector path of transistor Q. In particular, diode D1 has its anode connected to node C and its cathode connected to the collector of transistor Q. Diode D1 prevents transistor Q from transmitting current in the opposite direction from normal. Aside from this, diode D1 does not affect the operation of the reference.

Figure 3B:
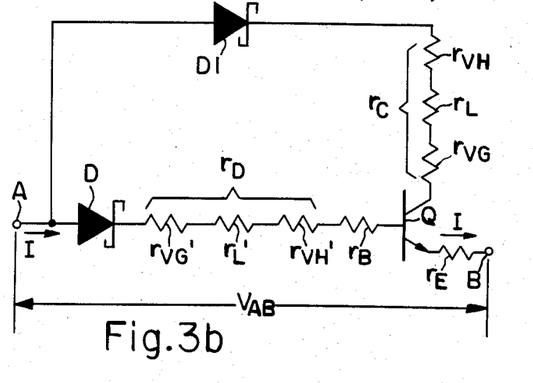

Elements D and Q have intrinsic semiconductor resistances which are explicitly shown in FIG. 3b. The cathode of diode D again has resistance $r_D$, while the base, collector, and emitter of transistor Q again have respective resistances $r_B$, $r_C$, and $r_E$. The anodes of diodes D and D1 are conductors which have no intrinsic semiconductor resistances. The intrinsic resistance of the cathode of diode D1 is the same as $r_C$.

Inasmuch as most of the current through transistor Q goes through its collector rather than through its base, device operation is materially affected by the internal resistance(s) in the collector path. By having the collector connected to the anode of diode D rather than to its cathode as in the above prior art voltage reference, the collector current does not pass through resistance $r_D$ and the rectifying junction of diode D. This avoids a significant voltage drop across diode D. Consequently, the present reference has a lower impedance than the prior art reference. Importantly, reference voltage $V_{AB}$ in FIGS. 3a and 3b is more sensitive to changes in temperature T at constant current I. This is advantageous in certain circuits, particularly some feedback applications.

The increased temperature sensitivity and impedance difference can be seen mathematically by comparing voltage $V_{AB}$ for the two references. Taking the intrinsic resistances into account, the relationship for voltage $V_{AB}$ in FIGS. 3a and 3b is:

$$V_{AB} = (kT/q)\ln[I/I_{SS}(\beta+1)] + Ir_D/(\beta+1) + Ir_B/(\beta+1) + \phi_{BE} + Ir_E \qquad (2)$$

The last three terms in Eqs. (1) and (2) are respectively the same. The first two terms in Eq. (2) differ from the corresponding terms in Eq. (1) and provide the greater temperature compensation. Upon subtracting $V_{AB}$ of Eq. (1) from $V_{AB}$ of Eq. (2), the voltage difference $\Delta V_{AB}$ between the two references is approximately:

$$\Delta V_{AB} \approx -(kT/q)\ln\beta - Ir_D \qquad (3)$$

where $\beta+1$ has been approximated by $\beta$ since $\beta$ is much greater than 1. The first term in Eq. (3) is the result of the reduced current through the rectifying junction of diode D, while the second term is the result of the reduced current through resistance $r_D$.

As temperature T increases from about 225° K. to about 400° K., a typical increase in $\beta$ is from about 15–30 to about 120–150. The magnitude of the first term in Eq. (3) thus increases as the temperature is raised from 225° K. to 400° K. Diode resistance $r_D$ changes only slightly (typically 3–4%) over the same temperature range. Accordingly, $\Delta_{AB}$ becomes increasingly more negative as temperature increases. That is, voltage $V_{AB}$ of FIGS. 3a and 3b decreases more rapidly with increasing temperature than in the prior art voltage reference. Furthermore, $\Delta V_{AB}$ is always negative. Accordingly, voltage $V_{AB}$ is always lower in the present reference than in the prior art reference so that the impedance is lower in the present reference.

Figure 4:
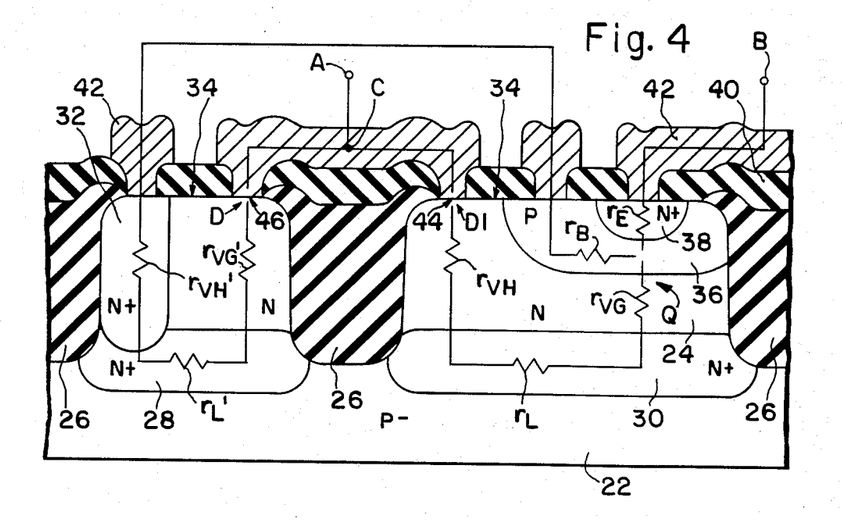
FIG. 4 is a cross-sectional side view of a semiconductor structure for the voltage reference of FIGS. 3a and 3b.

The elemental locations for the intrinsic resistances are indicated in FIG. 4 which depicts a cross-sectional side view for the reference of FIGS. 3a and 3b. This reference is incorporated in a semiconductor body containing a lowly doped P− monocrystalline silicon substrate region 22 on which there is an N epitaxial silicon layer 24. Active regions for elements D and Q are laterally separated from each other by a region 26 of silicon dioxide which extends through layer 24 slightly into substrate 22. Located generally along the interface between substrate 22 and layer 24 are highly doped N+ buried layers 28 and 30 which respectively provide internal conductive connections for elements D and Q. A highly doped N+ diffused region 32 provides a conductive connection from the upper surface 34 of layer 24 down to buried layer 28. A P base region 36 laterally and upwardly encloses a highly doped N+ emitter region 38 along upper surface 34 in the active region for vertical transistor Q. An electrically insulating layer 40 of silicon dioxide lies along upper surface 34. Finally, a patterned metal layer 42 lies on the top of insulation layer 40 and extends down through holes in it to make electrical contact with portions of layer 24, including regions 32, 36, and 38.

In the semiconductor material, the portion of epitaxial layer 24 underlying base region 36, buried layer 30, and the portion of layer 24 extending up to the rectifying junction 44 for diode D1 form the collector for transistor Q. These three semiconductor segments respectively have internal resistances $r_{VG}$, $r_L$, and $r_{VH}$ whose sum is $r_C$. Similarly, N+ plug 32, buried layer 28, and the portion of epitaxial layer 24 underlying the rectifying junction 46 of diode D form its cathode. These semiconductor segments respectively have internal resistances $r_{VG}'$, $r_L'$, and $r_{VH}'$ whose total is $r_D$. Typically, $r_B$ is on the order of 400 ohms, while $r_C$ and $r_D$ are each around 20–30 ohms, $r_C$ being about 5 ohms less than $r_D$. As to $r_E$, it is so much less than 1 ohm as to be negligible for most considerations.

Figure 5:
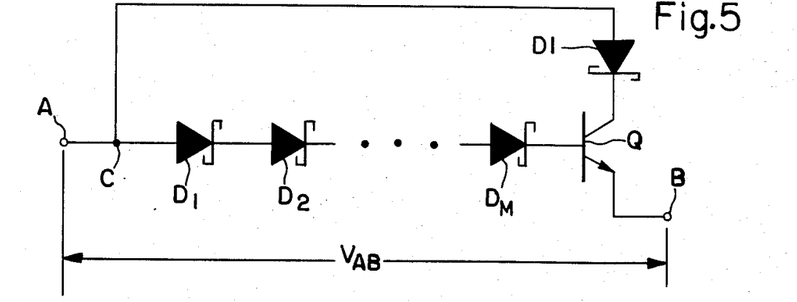
FIG. 5 is a circuit diagram of another embodiment of a voltage reference in accordance with the invention.

FIG. 5 illustrates a generalized versin of the present voltage reference in which M Schottky diodes $D_1$, $D_2$ . . . and $D_M$ are arranged forwardly in series with the base-emitter junction of transistor Q. Its collector is connected through diode D1 and node C to the $D_1$ anode, while its base is connected to the $D_M$ cathode. In simplified form, reference voltage $V_{AB}$ equals $MV_{SH}+V_{BE}$. $V_{SH}$ is the forward diode-drop voltage for a Schottky diode. $V_{BE}$ is the forward base-to-emitter voltage for an NPN transistor. The reference of FIG. 5 operates in the same manner as that of FIGS. 3a and 3b to provide voltage $V_{AB}$ when elements $D_1$–$D_M$ and Q (and also D1) are all conductive. FIGS. 3a and 3b thus represent the situation in FIG. 5 where M is 1. PN-junction diodes could be used in place of some or all of diodes $D_1$–$D_M$.

Figure 6:
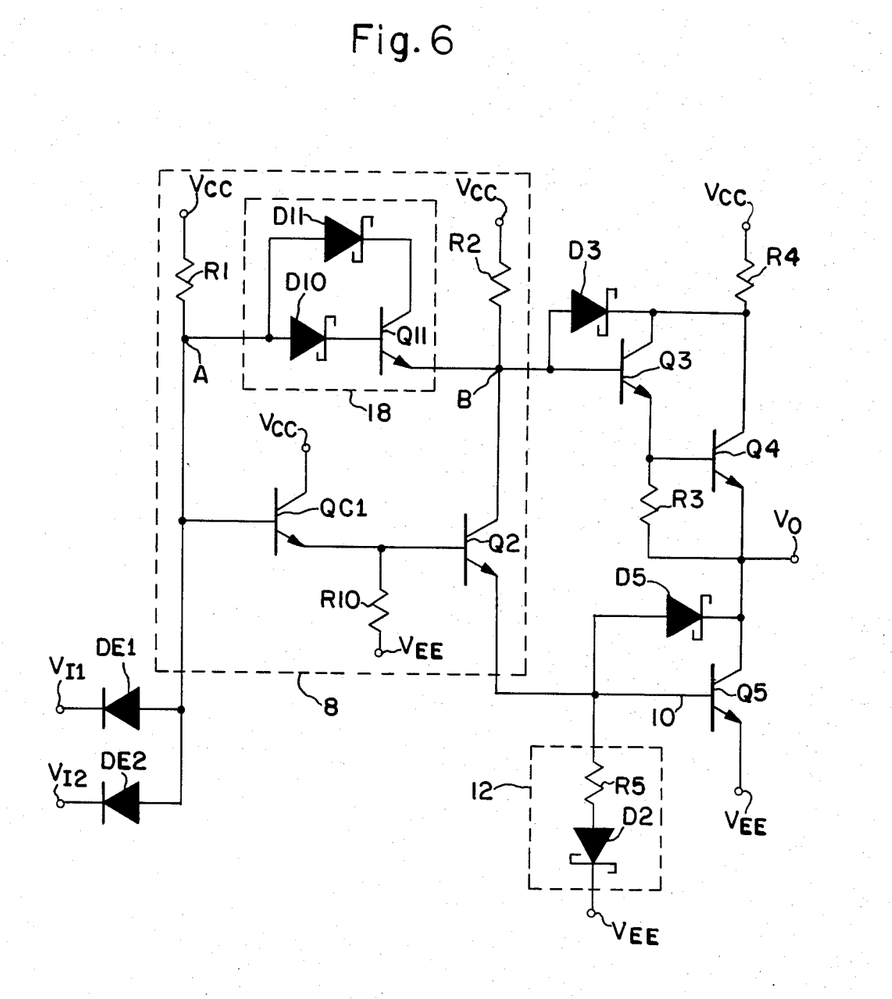
FIGS. 6 and 7 are circuit diagrams of TTL-type NAND gates containing "kicker" circuits using the voltage reference of FIGS. 3a and 3b.

The voltage reference of FIGS. 3a and 3b is employable in a TTL-type NAND gate as shown in FIG. 6. This bipolar gate has many of the elements of the basic TTL gate of FIG. 2a. In particular, the gate of FIG. 6 contains NPN transistors Q2, Q3, Q4, and Q5 and resistors R2, R3, R4, and R5 configured the same as in FIG. 2a. NPN input transistor QC1 and PN-junction input diodes DE1 and DE2 which respectively receive inputs $V_{I1}$ and $V_{I2}$ replace transistor Q1 and are connected to each other and to resistor R1 in the way described above for FIG. 2b. The $V_{CC}$ supply is connected directly to the QC1 collector; this prevents transistor QC1 from saturating. Schottky diodes D3 and D5 respectively clamp transistors Q3 and Q5 out of deep saturation. In addition, a Schottky diode D4 is connected between the $V_{EE}$ supply and resistor R5 in pull-down circuit 12.

This NAND gate has a "kicker" circuit 8 containing input transistor QC1, drive transistor Q2, and a voltage reference 18. Resistors R1 and R2 are also shown as part of kicker circuit 8. A resistor R10 is connected to the QC1 emitter; as a result, transistor QC1 is conductive whenever inputs $V_{I1}$ and $V_{I2}$ are both above $V_{EE}$. Voltage reference 18 consists of an NPN transistor Q11 and Schottky diodes D10 and D11 configured respectively the same as elements Q, D, and D1 in FIG. 3a and operable in the same manner. Terminal A is connected to the QC1 base, while terminal B is connected to the Q2 collector.

Kicker circuit 8 works as follows, starting with at least one of inputs $V_{I1}$ and $V_{I2}$ at a logical "0" (hereafter usually just "0") and with elements Q11, D10, and D11 turned off. When the last input $V_{I1}$ or $V_{I2}$ at "0" starts rising toward a logical "1" (hereafter usually just "1"), transistor QC1 rapidly provides a large amount of current to transistor Q2 to turn it on very quickly. This occurs because only transistor QC1 lies in the current path between the $V_{CC}$ supply and the Q2 base. The rapid turning on of transistor Q2 enables transistor Q5 to turn on quickly.

The Q2 collector voltage then drops, enabling elements Q11, D10, and D11 to turn on. Reference voltage $V_{AB}$ is imposed across the series combination of the QC1 base-emitter junction and the Q2 base-collector junction so as to prevent the Q2 collector from dropping much further. This clamps transistor Q2 out of deep saturation. When input $V_{I1}$ or $V_{I2}$ later goes low, transistor Q2 thus turns off very quickly so as to enhance the turn off of transistor Q5.

As temperature increases, the saturation voltage for transistor Q2 also increases. That is, transistor Q2 is capable of reaching a given saturation level at a progressively higher collector-to-emitter voltage as temperature rises. Voltage reference 18 counteracts this by providing voltage $V_{AB}$ at a progressively lower value with increasing temperature so that transistor Q2 cannot reach its saturation voltage. Compared to the situation that would arise if the voltage reference of FIGS. 1a and 1b were used instead, reference 18 provides voltage $V_{AB}$ at a lower value which clamps transistor Q2 further out of saturation. In short, the connection of the QC1 collector to the $V_{CC}$ supply allows transistor Q2 to turn on rapidly while reference 18 prevents transistor Q2 from saturating so that it turns off quickly.

Figure 7:
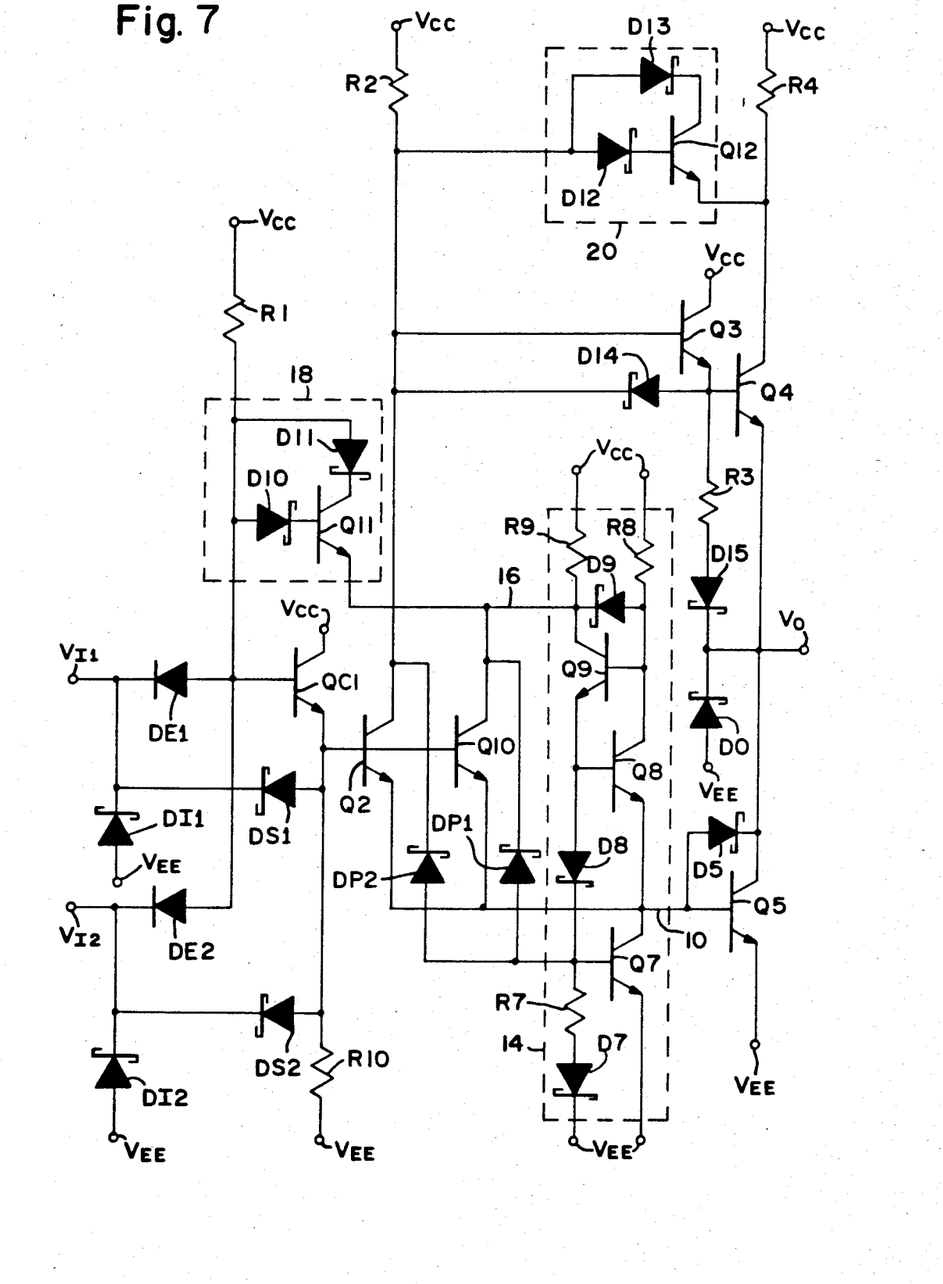

Turning to FIG. 7, it illustrates a preferred TTL-type NAND gate in which a kicker circuit as in FIG. 6 is employed in conjunction with an active pull-off circuit 14 for discharging the base of output transistor Q5 to the $V_{EE}$ supply when phase-splitting drive transistor Q2 turns off so as to help turn off transistor Q5. Pull-off circuit 14 also diverts the Q2 collector-to-emitter current away from the Q5 base to the $V_{EE}$ supply as transistor Q2 is turning off. This further helps turn off transistor Q5.

The gate of FIG. 7 further contains transistors QC1, Q3, and Q4, diodes DE1, DE2, and D5, and resistors R1, R2, R3, R4, and R10 configured as in FIG. 6 and operable in essentially the same manner except that the Q3 collector is tied directly to the $V_{CC}$ supply so as to keep transistor Q3 out of saturation. Schottky diodes DI1 and DI2 respectively prevent input voltages $V_{I1}$ and $V_{I2}$ from dropping more than $1V_{SH}$ below $V_{EE}$. A Schottky diode D0 likewise prevents output voltage $V_O$ from dropping more than $1V_{SH}$ below $V_{EE}$.

In addition to driving the base of regular phase splitter Q2, the QC1 emitter drives the base of another NPN phase-splitting drive transistor Q10 whose emitter is connected in common with the Q2 emitter to the Q5 base. Transistors Q2 and Q10 which are matched have their bases further connected to the anodes of Schottky diodes DS1 and DS2 whose cathodes respectively receive voltages $V_{I1}$ and $V_{I2}$. Diodes DS1 and DS2 in combination with resistor RIO facilitate the turning off of transistors Q2 and Q10 by drawing off charge from their bases during turn-off.

Pull-off circuit 14 consists of an NPN pull-off transistor Q7 and a control circuit connected to the base and collector of transistor Q7 to regulate its operation so as to enable it to provide the requisite discharge path from the Q2 emitter and the Q5 base to the $V_{EE}$ supply. Transistor Q7 has its emitter tied to the $V_{EE}$ supply and its collector connected by way of line 10 to the Q2 emitter and the Q5 base. The control circuit turns on transistor Q7 to open the discharge path in response to the turning off of transistor Q2. When transistor Q2 turns back on, the control circuit responds by turning off transistor Q7 to close the discharge path.

The control circuit contains a circuit for discharging the base of pull-off transistor Q7 as it turns off. This discharge circuit preferably consists of a resistor R7 and an optional Schottky diode D7 connected in series between the Q7 base and the $V_{EE}$ supply.

The control circuit has an NPN sensing transistor Q8 whose emitter is connected to the Q7 collector. The diode defined by the Q8 base-emitter junction senses the Q7 collector voltage. This provides feedback to the control circuit to enable it to keep transistor Q7 turned on when transistor Q2 is turned off. Transistors Q7 and Q8 are matched to each other.

A voltage reference element is connected between the Q7 and Q8 bases so that there is a reference voltage (drop) $V_R$ from the Q8 base to the Q7 base when transistors Q7 and Q8 are simultaneously conductive. $V_R$ is less than the Q5 $V_{BE}$. This condition is met in FIG. 7 where the reference element is a Schottky diode D8 oriented forwardly in series with the Q7 base-emitter junction. $V_R$ thereby equals $1V_{SH}$. When transistors Q7 and Q8 are both turned on so that transistor Q5 is turned off, the Q5 base-to-emitter voltage equals the Q7 $V_{BE}$ plus $V_R$ minus the Q8 $V_{BE}$. Since transistors Q7 and Q8 are matched, their $V_{BE}$'s are nearly the same. Accordingly, the Q5 base-to-emitter voltage equals $V_R$, assuring that transistor Q5 is indeed off.

A bias circuit in the control circuit provides a bias current through diode D8 to the base of transistor Q7 when it is turned on. The bias circuit contains an NPN transistor Q9 whose emitter is coupled in common to the D8 anode and the Q8 base. Transistor Q9 has its base connected to the Q8 collector and also to a current source consisting of a resistor R8 connected to the $V_{CC}$ supply. The Q9 collector is connected to another current source formed by a resistor R9 tied to the $V_{CC}$ supply. A Schottky diode D9 is cathode-to-anode connected between the collector and base of transistor Q9 to clamp it out of deep saturation.

A trigger circuit "triggers" the bias circuit to enable it to provide the bias signal at a voltage sufficient to turn on transistor Q7 in response to transistor Q2 turning off. When transistor Q2 turns back on, the trigger circuit "detriggers" the bias circuit so that it cuts the bias voltage down to a level adequate to turn transistor Q7 back off. The principal element of the trigger circuit is transistor Q10 whose collector is connected by way of a line 16 to the junction of the Q9 collector, the D9 cathode, and the lower end of resistor R9. Transistor Q10 switches substantially simultaneously with transistor Q2 to provide the triggering/detriggering action. Inasmuch as transistor Q10 is not operably connected to the R2 source, pull-off circuit 14 does not load the R2 source when transistors Q2 and Q10 are turned off.

Transistor QI0 is part of a kicker circuit that also includes transistor QC1 and voltage reference 18 consisting of elements Q11, D10, and D11 configured as in FIG. 6. This kicker circuit acts to speed up the switching of transistor Q10 in the same way that kicker circuit 8 speeds up the switching of transistor Q2 in FIG. 6. This also acts to speed up the switching of transistor Q2 in FIG. 7 because the changes in transistor Q10 are largely mirrored in transistor Q2.

Transistors Q3, Q4, and a voltage reference 20 form a circuit that operates like circuit 18 in FIG. 6. Reference 20 is configured in the same way as the reference of FIGS. 3a and 3b to act as a sensing element that prevents transistor Q4 from saturating. In particular, a Schottky diode D12 is anode-to-cathode connected between the Q3 base and the base of an NPN transistor Q12 whose emitter is connected to the Q4 collector. The Q12 collector is coupled to the D12 anode through a Schottky diode D13 which prevents current from flowing through transistor Q12 in the reverse direction.

A Schottky diode DP1 is cathode-to-anode connected between the Q10 collector and the Q7 base. Another Schottky diode DP2 is similarly connected between the Q2 collector and the Q7 base. Diodes DP1 and DP2 enhance the turning on of transistor Q7 by capacitively coupling charge to the Q7 base from the collectors of transistors Q10 and Q2 as they turn off. This more quickly opens the discharge path through transistor Q7 to the $V_{EE}$ supply when transistors Q2 and Q10 turn off so as to enable transistor Q5 to turn off faster.

This gate also contains Schottky diodes D14 and D15 connected as shown in FIG. 7. Diode D14 is used to remove charge from transistor Q4. Diode D15 allows output $V_O$ to settle at a voltage below the base voltage of transistor Q4 when it is turned off.

In FIG. 7, supplies $V_{CC}$ and $V_{EE}$ are preferably 5.0 volts and 0 volts, respectively. The switching point for inputs $V_{I1}$ and $V_{I2}$ is $2V_{BE}$, while their nominal "0" and "1" levels are less than 0.8 volt and more than 2.0 volts, respectively. The nominal "0" and "1" levels for output $V_0$ are less than 0.55 volt and more than 2.0 volts, respectively. A standard $V_{BE}$ is about 0.75 volt. $V_{SH}$ is about 0.5 volt. Resistors R1, R2, R3, R4, R7, R8, R9, and R10 are preferably 10,000 ohms, 1,200 ohms, 290 ohms, 25 ohms, 1,500 ohms, 10,000 ohms, 1,200 ohms, and 15,000 ohms, respectively.

The gate of FIG. 7 operates in the following manner. Assume that voltages $V_{I1}$ and $V_{I2}$ are initially at "1". Voltage $V_0$ is at "0". Diodes D7, D8, DE1, DE2, DP1, DP2, D12 and D13 are non-conductive as are transistors Q7, Q8, Q9, Q3, Q4, and Q12. Transistors QC1, Q11, and Q5 are conductive along with diodes D10, D11, D9, and D5. Current is provided from the R1 source to bias transistor QC1 which supplies current to transistors Q2 and Q10 so that they are turned on. Current from the R8 and R9 sources and from the R1 source by way of reference 18 is provided through transistor Q10 to the Q5 base. This current is in addition to that provided from the R2 source. Reference 18 keeps transistor Q10 out of saturation.

At least one of inputs $V_{I1}$ and $V_{I2}$—e.g., input $V_{I1}$—is dropped to "0". Diode DE1 turns on, causing transistor QC1 to effectively turn off. This causes transistors Q2, Q10, and Q11 and diodes D10 and D11 to turn off. As transistor Q10 turns off, its collector voltage rises which triggers the bias circuit in circuit 14 by allowing the Q9 collector and base voltages to rise. A point is rapidly reached at which transistor Q9 and diodes D7 and D8 become conductive. This slows down the rate at which the Q9 collector voltage rises. Diode D9 typically turns off.

The R9 source now provides bias current for transistor Q7 which turns on. This opens the discharge path from the Q2 and Q10 emitters and the Q5 base through transistor Q7 to the $V_{EE}$ supply so as to enable output transistor Q5 to turn off. Diode D5 also turns off. As transistor Q2 continues to turn off, the R2 current still going through transistor Q2 is transmitted through transistor Q7 to the $V_{EE}$ supply so as to enhance removal of the base drive for output transistor Q5. Likewise, the charge in the Q5 base discharges through transistor Q7 to the $V_{EE}$ supply.

As transistor Q7 turns on, its collector voltage drops. This drop is sensed by the emitter of transistor Q8 which turns on as soon as the voltage drop is great enough to conductively forward bias the Q8 base-emitter junction. Transistor Q8 draws current from the R8 source, causing the voltage drop across resistor R8 to increase. This reduces the Q9 base voltage. Transistor Q9 then becomes slightly less conductive and transmits slightly less current from the R9 source to the Q7 base. In turn, the collector voltage of transistor Q7 rises slightly as it becomes less conductive. Transistor Q8 senses the increase in the Q7 collector voltage and also starts to become slightly less conductive. This causes a smaller change in the voltage drop across resistor R8. The sequence just described then repeats itself with smaller voltage changes until transistors Q7, Q8, and Q9 finally stabilize in their active regions. At this point, the voltage across the Q5 base-emitter junction equals $V_R$.

While transistor Q5 is turning off, transistor Q3 turns on and provides current to transistor Q4 to turn it on and actively pull output $V_0$ up to "1". Elements Q12, D12, and D13 in reference 20 turn on to prevent the Q4 collector voltage from dropping to the saturation level.

Basically the reverse occurs when voltage $V_{I1}$ is returned to "1". Diode DE1 turns back off, causing transistor QC1 to turn back on and provide a current kick to turn on transistors Q10 and Q2. Elements Q11, D10, and D11 in reference 18 soon turn on to prevent transistor Q10 from saturating. This also prevents transistor Q2 from going into deep saturation.

The turning on of transistor Q10 reduces the Q9 collector voltage and diverts current from the R9 source away from transistor Q9 to transistor Q10. If diode D9 was turned off, it turns on. As the base voltage of transistor Q9 drops, it soon turns off. The charge in the Q7 base discharges to the $V_{EE}$ supply through elements R7 and D7. In combination with diode D8, they also provide a discharge path for the charge in the Q8 base. Transistor Q5 turns back on to pull voltage $V_0$ down to "0". Diode D5 turns on shortly thereafter to clamp transistor Q5 out of deep saturation. Transistors Q3, Q4, and Q12 turn off as do diodes D12 and D13.

Methods for manufacturing the various elements of the present circuits are well known in the semiconductor art. These circuits are preferably manufactured in monolithic integrated circuit form according to conventional planar processing techniques using oxide (or PN-junction) isolation to separate active regions on a semiconductor wafer. The Schottky diodes are likewise formed according to standard Schottky processing techniques.

While the invention has been described with reference to particular embodiments, this description is solely for the purpose of illustration and is not to be construed as limiting the scope of the invention claimed below. For example, semiconductor elements of opposite polarity to those described above may be employed to accomplish the same results except that many of the Schottky diodes would be deleted, formed in separate active semiconductor regions, or replaced with PN-junction diodes. Thus, various modifications, changes, and applications may be made by those skilled in the art without departing from the true scope and spirit of the invention as defined by the appended claims.

What is claimed is:

1. A voltage reference which provides a reference voltage between a first terminal and a second termrnal at variable voltage the voltage reference comprising:
    a diode having a first electrode and a second electrode that form a rectifying junction;
    a bipolar transistor having a collector coupled to a node between the first terminal and the first electrode, an emitter coupled to the second terminal, and a base coupled to the second electrode such that the diode is oriented in the forward conductive direction of the base-emitter junction of the transistor.

2. A voltage reference as in claim 1 further including at least one further diode serially coupled between the second electrode and the base in the forward conductive direction of the base-emitter junction.

3. A voltage reference as in claim 1 wherein the diode is a Schottky diode.

4. A voltage reference as in claim 3 wherein the transistor is an NPN transistor.

5. A voltage reference as in claim 4 further including a Schottky diode having its anode coupled to the node and its cathode coupled to the collector 6. A voltage reference as in claim 4 wherein the transistor lies in a semiconductor body along a surface thereof and is a vertical transistor generally oriented perpendicular to the surface.

7. A circuit comprising:
   a voltage reference which provides a reference voltage between a first terminal and a second terminal, the reference comprising (1) a diode having a first electrode and a second electrode that form a rectifying junction and (2) a first bipolar transistor having a collector coupled to a node between the first terminal and the first electrode, an emitter coupled to the second terminal, and a base coupled to the second electrode such that the diode is oriented in the forward conductive direction of the base-emitter junction of the transistor;
   a like-polarity second bipolar transistor having a collector coupled to a first voltage supply, an emitter, and a base coupled to the first terminal; and
   a like-polarity third bipolar transistor having a collector coupled to the second terminal, an emitter, and a base coupled to the emitter of the second transistor.

8. A circuit as in claim 7 wherein the magnitude of the forward voltage across the diode when it is conductive is less than the magnitude of the forward voltage across the base-emitter junction of any of the transistors when they are also conductive.

9. A circuit as in claim 8 further including:
   a resistor coupled between the first terminal and the voltage supply; and
   a resistor coupled between the second terminal and the voltage supply.

10. A circuit as in claim 9 wherein the terminals are at variable voltages.

11. A circuit as in claim 7 wherein the diode is a Schottky diode.

12. A circuit as in claim 11 wherein the collector of the second transistor is directly connected to the voltage supply.

13. A circuit as in claim 12 further including:
   a resistor coupled between the first terminal and the voltage supply; and
   a resistor coupled between the second terminal and the voltage supply.

14. A circuit as in claim 13 further including a Schottky diode having its anode coupled to the node and its cathode coupled to the collector of the first transistor.

15. A circuit as in claim 13 wherein the terminals are at variable voltages.

16. A gate comprising:
   a voltage reference which provides a reference voltage between a first terminal and a second terminal, the reference comprising (1) a Schottky diode having a first electrode and a second electrode that form a rectifying junction and (2) a first bipolar transistor having a collector coupled to a node between the first terminal and the first electrode, an emitter coupled to the second terminal, and a base coupled to the second electrode such that the diode is oriented in the forward conductive direction of the base-emitter junction of the transistor;
   a like-polarity second bipolar transistor having a collector coupled to a first voltage supply, an emitter, and a base coupled to the first terminal;
   a like-polarity third bipolar transistor having a collector coupled to the second terminal, an emitter, and a base coupled to the emitter of the second transistor;
   at least one input diode coupled to the first terminal so as to be back-to-back with the base-emitter junction of the second transistor; and
   a like-polarity output bipolar transistor having a collector, an emitter coupled to a second voltage supply, and a base coupled to the emitter of the third transistor.

17. A gate as in claim 16 wherein the terminals are at variable voltages.

18. A gate comprising:
   a voltage reference which provides a reference voltage between a first terminal and a second terminal, the reference comprising (1) a Schottky diode having a first electrode and a second electrode that form a rectifying junction and (2) a first bipolar transistor having a collector coupled to a node between the first terminal and the first electrode, an emitter coupled to the second terminal, and a base coupled to the second electrode such that the diode is oriented in the forward conductive direction of the base-emitter junction of the transistor;
   a like-polarity second bipolar transistor having a collector coupled to a first voltage supply, an emitter, and a base coupled to the first terminal;
   a like-polarity third bipolar transistor having a collector coupled to the second terminal, an emitter, and a base coupled to the emitter of the second transistor;
   at least one input diode coupled to the first terminal so as to be back-to-back with the base-emitter junction of the second transistor;
   a resistor coupled between the first terminal and the first voltage supply;
   a like-polarity fourth bipolar transistor having a collector, an emitter, and a base coupled to the emitter of the second transistor;
   a resistor coupled between the collector of the fourth transistor and the first voltage supply; and
   a like-polarity output bipolar transistor having a collector, an emitter coupled to a second voltage supply, and a base coupled to the emitters of the third and fourth transistors.

19. A gate as in claim 18 wherein the collector of the second transistor is directly connected to the first voltage supply.

20. A gate as in claim 19 wherein the terminals are at variable voltages.

* * * * *

UNITED STATES PATENT AND TRADEMARK OFFICE
CERTIFICATE OF CORRECTION

PATENT NO.   :   4,542,331

DATED        :   September 17, 1985

INVENTOR(S)  :   Richard M. Boyer

It is certified that error appears in the above-identified patent and that said Letters Patent is hereby corrected as shown below:

Claim 1, line 2, change "termrnal" to --terminal--;

line 3, change "at variable voltage" to
--which are at variable voltages,--.

Signed and Sealed this

Twenty-eighth Day of May, 1991

Attest:

HARRY F. MANBECK, JR.

Attesting Officer

Commissioner of Patents and Trademarks